United States Patent [19]

Fair

[11] Patent Number: 5,208,643
[45] Date of Patent: May 4, 1993

[54] METHOD OF AND APPARATUS FOR NON-CONTACT TEMPERATURE MEASUREMENT

[75] Inventor: James A. Fair, Mountain View, Calif.

[73] Assignee: Varian Associates, Inc., Palo Alto, Calif.

[21] Appl. No.: 594,528

[22] Filed: Oct. 5, 1990

[51] Int. Cl.$^5$ .............................................. G01J 5/48
[52] U.S. Cl. ..................... 356/43; 356/445; 356/446; 374/161; 250/338.1; 118/666
[58] Field of Search ............... 356/43, 445, 446, 448; 364/557; 250/338; 374/161, 162, 163, 120, 123; 118/666, 667, 712, 715

[56] References Cited

U.S. PATENT DOCUMENTS

| | | | |
|---|---|---|---|
| 4,522,510 | 6/1985 | Rosencwaig et al. | 356/43 |
| 4,711,790 | 12/1987 | Morishige | 118/666 |
| 4,823,291 | 4/1989 | Berman | 356/43 |

OTHER PUBLICATIONS

Donnelly et al., *Journal of Vacuum Science Technology*, Jan.-Feb. 1990, pp. 84–92.
Hacman, *Optik*, vol. 28, p. 115, 1968.
Bond et al., *Journal of Vacuum Science Technology*, Mar. 1981, pp. 335–338.
Saenger, *Journal of Applied Physics*, Apr. 15, 1988, pp. 2522–2525.

Primary Examiner—Vincent P. McGraw
Assistant Examiner—LaCharles P. Keesee
Attorney, Agent, or Firm—James M. Williams

[57] ABSTRACT

The temperature and radiant energy emissivity of a semiconductor substrate or wafer undergoing processing are monitored by combining indications derived from an interferometer and the intensity of radiant energy emitted from the substrate. The radiant energy intensity is detected at adjacent maxima or minima in the intensity of the interference pattern.

25 Claims, 3 Drawing Sheets

METHOD OF AND APPARATUS FOR NON-CONTACT TEMPERATURE MEASUREMENT

FIELD OF INVENTION

The present invention relates generally to an apparatus for and method of measuring the temperature of a plate, such as a semiconductor wafer, that is not opaque to optical energy, and more particularly to such a method and apparatus wherein a non-contact arrangement provides an indication of temperature by combining outputs of an interferometer and a monitor of intensity of radiant energy emitted from the plate.

BACKGROUND ART

In many situations it is desirable to determine the temperature of a plate by non-contact arrangements. This is particularly the case in determining production worthiness of semiconductor wafers undergoing processing during the manufacture of high-density integrated circuits. The semiconductor wafer, i.e., substrate, usually formed of silicon or a III-V or II-VI compound such as gallium arsenide or zinc telluride, is typically in a high-vacuum environment, usually containing corrosive gases. This environment frequently has an adverse effect on conventional temperature monitoring probes that are in physical contact with the wafer. Contact between the probe and wafer causes wafer defects in the vicinity of the contact area. Such contact causes high-density circuitry near the contact area to be essentially destroyed, thereby reducing wafer yield and the number of chips obtained from the wafer.

To avoid the problems associated with temperature probes being in contact with the wafer, optical pyrometers are frequently used to monitor wafer temperature. To provide an accurate indication of substrate temperature from an optical pyrometer, the emissivity of the substrate must be known. With currently available pyrometer techniques, it is very difficult, if not impossible, to ascertain accurately emissivity of a semiconductor wafer undergoing processing for manufacture of integrated circuits. Generally, emissivity is approximated for the particular environmental conditions. This is not usually an accurate solution.

At temperatures below approximately 600° C., undoped silicon is very transparent to infrared energy. As the temperature or doping level of the wafer increases, the wafer becomes less transparent to infrared energy. The decrease in transparency causes the emissivity of radiant energy that can be detected by an optical pyrometer to change in a fairly unpredictable manner. Emissivity of optical energy from the wafer is also dependent on how rough the wafer emitting face is. In addition, wafer emissivity as a whole is a function of material deposited on the face of the substrate in the optical pyrometer field of view. Since emissivity from the substrate is variable for the reasons mentioned, the output of the optical pyrometer is frequently not an accurate indication of wafer temperature. Despite the known inaccuracies of optical pyrometers, these instruments are generally preferred to the more accurate measurements attained with contact techniques.

It is, accordingly, an object of the present invention to provide a new and improved more accurate non-contact apparatus for and method of measuring temperature of a plate non-opaque to optical energy, such as a semiconductor wafer undergoing processing.

Another object of the invention is to provide a new and improved non-contact method of and apparatus for determining temperature of a plate non-opaque to optical energy.

Another object of the invention is to provide a new and improved apparatus for and method of monitoring the temperature of a semiconductor wafer undergoing processing in a vacuum, chamber with use of only non-contact optical equipment.

A further object of the invention is to provide a new and improved non-contact method of and apparatus for monitoring temperature of a plate non-opaque to optical energy, which plate has unpredictable variations in emissivity as functions of plate properties and the environment in which the plate is located.

DISCLOSURE OF THE INVENTION

In accordance with one aspect of the invention, a non-contact method of determining the temperature of a plate that is not opaque to optical energy includes irradiating the plate with monochromatic optical energy preferably derived from an infrared laser. As a result of an interferometer phenomenon the monochromatic optical energy is partially reflected from front and rear faces of the plate so that optical energy reflected from the front face and transmitted through the rear face includes interference fringes having intensities that periodically vary as a function of plate temperature. The intensity of the optical energy reflected from the front face or transmitted through the rear face is detected and used to assist in determining the plate temperature. In particular, the intensity of the optical energy reflected from the front face or through the rear face of the plate provides an indication of the plate emissivity. The intensity of radiant energy emitted from the plate is detected, for example, by an optical pyrometer. The detected radiant energy intensity and the intensity of the optical energy reflected from the front face of the plate are combined to derive an indication of plate temperature in absolute temperature terms.

In accordance with another aspect of the invention, non-contact means for determining the temperature of a semiconductor substrate undergoing processing in a vacuum chamber includes means for irradiating a face of the substrate with monochromatic optical energy having a wavelength that is partially reflected from front and rear faces of the substrate. The optical energy reflected from the front face and a portion of the optical energy reflected from the rear face constructively and destructively interfere at the front face as a function of substrate temperature to provide sequential interference fringes as a function of temperature. The intensity of the optical energy reflected from the front face is determined by a detecting means. An optical pyrometer detects the intensity of radiation emitted from the substrate. Responses from the optical pyrometer and the means for detecting the intensity of the optical energy reflected from the front face are combined to provide an indication of substrate temperature.

I am aware of prior art wherein the temperature of a heated plate, such as a substrate undergoing processing during integrated circuit manufacture, has been monitored by interferometer techniques. In particular, Donnelly et al., *Journal of Vacuum Science Technology*, January–February 1990, pages 84–92; Hacman, *Optik*, Vol. 28, page 115, 1968; Bond et al., *Journal of Vacuum*

Science Technology, March, 1981, pages 335-338 and Saenger, *Journal of Applied Physics*, Apr. 15, 1988, pages 2522-2525 disclose such systems. However, in each of these prior art systems, temperature is monitored by counting interference fringes. As pointed out in the Donnelly et al. article, the calibration technique for such a procedure is quite complex.

An even greater drawback to these prior art systems, particularly in an integrated circuit processing environment, is that the substrate initial temperature must be determined. Otherwise, the fringe count cannot be accurately related to an initial temperature. To determine initial substrate temperature accurately a contact must be placed on the substrate. Affixing a contact to the integrated circuit substrate causes a significant area of the substrate to be rendered useless, to reduce chip yield from the wafer. In addition, affixing a contact to the substrate is quite difficult, and perhaps impossible with existing technology, in a vacuum chamber where multiple wafers are processed without breaking the vacuum.

The above and still further objects, features and advantages of the present invention will become apparent upon consideration of the following detailed description of a specific embodiment thereof, especially when taken in conjunction with the accompanying drawings.

DESCRIPTION OF THE PREFERRED EMBODIMENT

Figure 1:
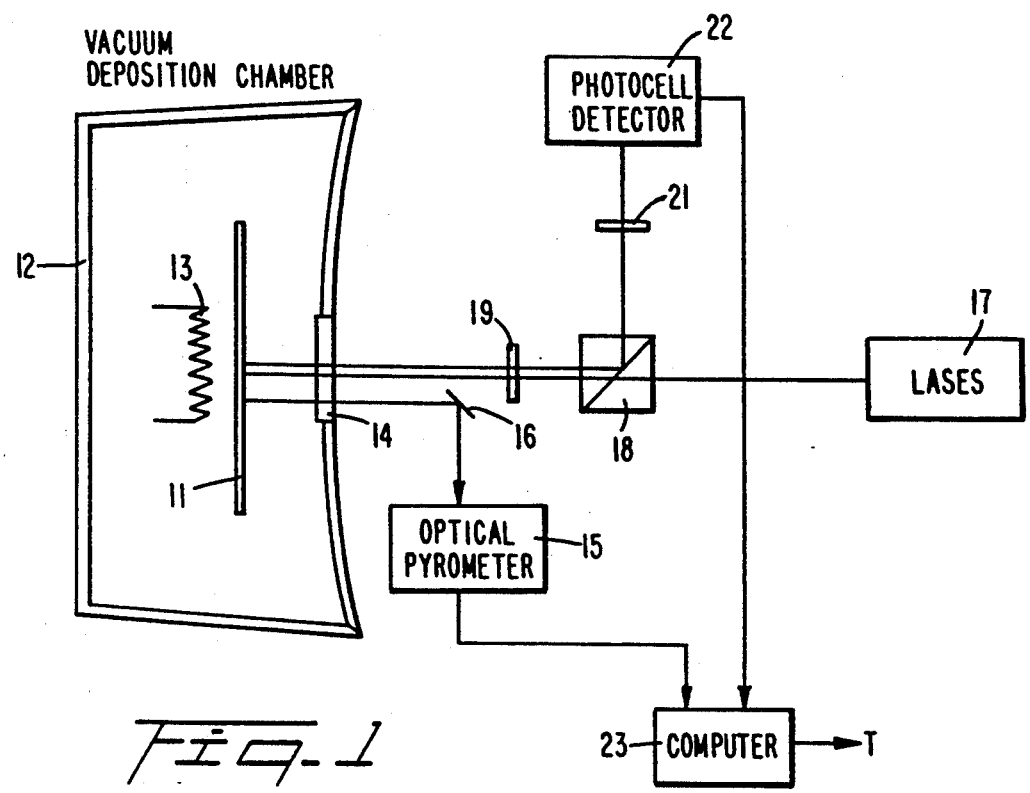
FIG. 1 is a schematic diagram of a preferred embodiment of the invention.

Reference is now made to FIG. 1 of the drawing wherein silicon wafer 11 is illustrated as being located in integrated circuit processing chamber 12, maintained at the usual high-vacuum level and including sources (not shown) of materials to be deposited on the wafer. Wafer 11 is heated during processing by resistive heating coil 13. Chamber 12 includes transparent port 14, positioned opposite wafer 11.

During processing, wafer 13 undergoes temperature variations. It is desirable to monitor the temperature of wafer 11 as it is being processed through the use of non-contact, optical techniques and devices. To these ends, the intensity of radiant energy emitted from the face of wafer 11 facing window 14 is monitored with conventional broad band optical pyrometer 15. The field of view of pyrometer 15 is through window 14 on a portion of the front face of wafer 11, i.e., the face of the wafer facing toward window 14. Pyrometer 15 derives an output signal having an amplitude proportional to the intensity of radiant energy emitted by the front face of wafer 11. For convenience, the infrared energy emitted from the front face of wafer 11 is reflected to pyrometer 15 by mirror 16.

Monochromatic energy having a planar wave front in the infrared band, preferably in the wavelength region between about 1 micron and 20 microns derived from optical laser 17, is incident on front face 41 of wafer 11. The monochromatic energy from laser 17 is coupled through beam splitter 18 and half wave plate 19 and window 14 to front face 41 of wafer 11. Preferably, the optical energy from laser 17 is normal to front face 41. Wafer 11 is not opaque to the wave length of laser 17, so that some of the laser energy is reflected from front face 41, while a portion of the optical energy from laser 17 is reflected from rear face 42 (parallel to front face 41) of wafer 11. The remainder of the optical energy from laser 17 incident on wafer 11 is transmitted through rear face 42. Some of the laser energy reflected from rear face 42 is transmitted through front face 41 while some of the laser energy reflected from rear face 42 is reflected internally of wafer 11 from front face 41. These reflection properties result in constructive and destructive interference patterns in the net energy from laser 17 that is reflected from the front face of wafer 11 as a function of wafer temperature.

The energy from laser 17 reflected from front face 41 of wafer 11 propagates back through window 14 and half wave plate 19 to beam splitter 18. In beam splitter 18, energy from the reflected laser from front face 41 is reflected through bandpass filter 21, transparent to the wavelength of laser 17, to photocell detector 22. Detector 22 derives a signal having an amplitude indicative of the energy of laser 17 that is reflected from front face 41 of wafer 11.

Output signals of pyrometer 15 and detector 22 are combined in computer 23. The computer is programmed to solve equations, indicated supra, which enable the temperature of wafer 11 to be determined even though the emissivity of the wafer is subject to change during wafer processing. In addition, computer 23 can derive a signal indicative of the emissivity of the wafer.

For many processing operations, silicon wafer 11 is at a temperature in excess of 600° C. At temperatures above 600° K., silicon changes from being virtually completely transparent to infrared energy from laser 17 to being partially transparent and partially opaque to the laser energy. Wafer 11 remains non-opaque to the energy of laser 17 until the wafer temperature reaches approximately 900° K., where the wafer becomes opaque. In the temperature range between 600° and 900° K., the reflection from wafer face 41 of radiation from laser 17 is therefore variable. The emissivity of wafer 11 also depends on roughness of and the presence of materials deposited on its front face 41. Hence, the output of optical pyrometer 15, does not, by itself, provide an accurate indication of the temperature of wafer 11.

It can be shown that for a plane wave, having a wavelength, $\lambda$, and peak amplitude, A, which is supplied by laser 17 to the front face of wafer 11, there is derived a reflected wave having an intensity I which is a sinusoidal function of temperature, provided that the wafer at the wave length of the energy, is non-opaque. In particular, the amplitude of the reflected energy at wavelength $\lambda$ is:

$$A = A_0\left(\frac{n-1}{n+1}\right)e^{-i\pi} + \quad (1)$$

$$A_0 \sum_{m=1}^{\infty} e^{-2im\Theta}\left(\frac{2}{n+1}\right)\left(\frac{2n}{n+1}\right)\left(\frac{n-1}{n+1}\right)^{2m-1}$$

where $$\theta = \frac{2\pi n\, l}{\lambda} \quad (2)$$

$A_0$ = amplitude of the wave from laser 17 incident on the front face of wafer 11, n = index of refraction of wafer 11, l = the thickness of wafer 11, m = is the number of rays from laser 11 that are transmitted through the back face of substrate or wafer 11;

since the number of such rays is infinite, the infinite series of Equation (1) is solvable.

The intensity, i.e., power, of the reflected wave from the front face of wafer 11 is equal to $I = |A|^2$. The intensity of reflected optical energy of laser 17 from front face 41 of wafer 11 varies in a predictable fashion with n,l and m. The temperature dependence of silicon wafer 11 is given by $$\frac{d(nl)}{dT} = n\frac{dl}{dT} + l\frac{dn}{dT} \quad (3)$$

where $$\frac{dl}{dT} = \frac{2.6\,(10^{-6})l}{K} = K_1 \quad (4)$$

$$\frac{dn}{dT} = \frac{1.5\,(10^{-4})}{K} = K_2 \quad (5)$$

Therefore, $$\frac{d(nl)}{dT} = nK_1 + lK_2 = K_3 \quad (6)$$

While the above analysis is given for a plane wave front having normal incidence on the front face of silicon wafer 11, it can easily be extended to other incident angles by considering the Fresnel formulae. At non-normal angles of incidence the reflection and transmission coefficients are polarization dependent.

Figure 2:
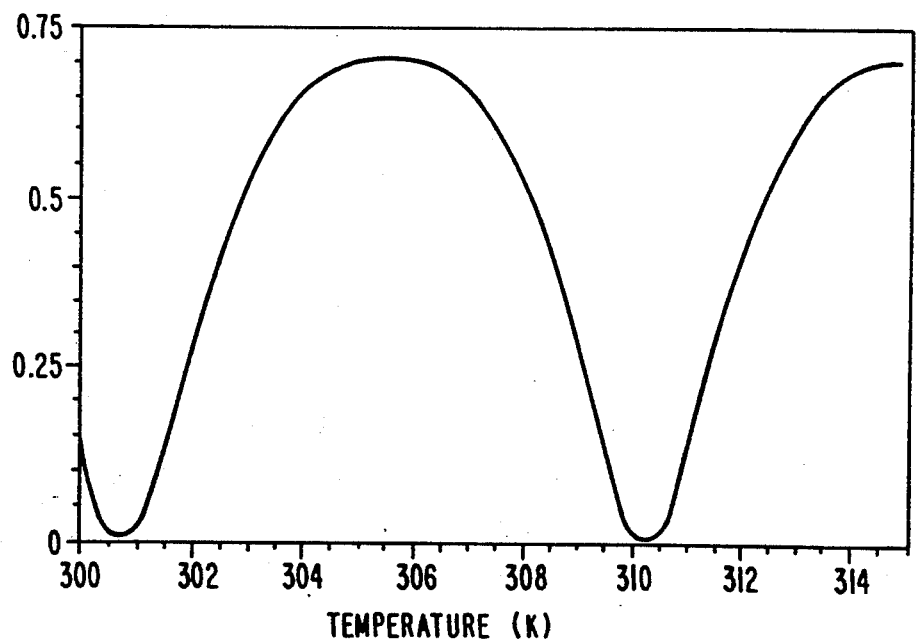
FIG. 2 is a plot of the output of an inferometer detector illustrated in FIG. 1, as a function of temperature for one situation.

The reflected intensity of a normal plane wave having a wave length of 1.5 microns from laser 17, as a function of temperature, is shown in FIG. 2 to be a sinusoid. From FIG. 2, the intensity of the reflected wave from front face 41 of silicon wafer 11 varies as a sinusoidal function at room temperatures in the vicinity of 300° K. Minimum intensity values for the sinusoidal function are at temperatures of approximately 300.75 and 310.25° K., with peaks occurring at approximately 305.5 and 314.5° K.

Figure 3:
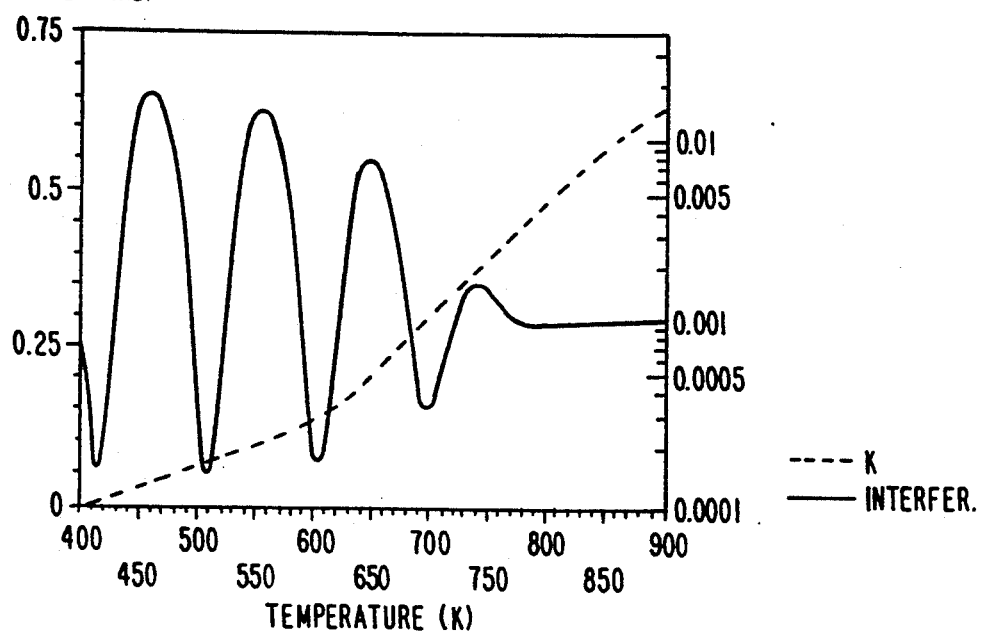
FIG. 3 is a plot of the output of the inferometer detector in accordance with a second situation.

As the temperature of wafer 16 increases, the amplitude of the reflected radiation from the front face of the wafer decreases. This is graphically illustrated in FIG. 3, for temperature variations of substrate 11 for laser energy having a longer wave length of 15 microns. The intensity of the reflected laser radiation from the front face of wafer 11 dampens in an exponential manner and reaches a constant value at a temperature at which the wafer becomes completely opaque to the relatively low level 15 micron coherent energy. Hence, the output of detector 22 is basically a periodic function dependent on the temperature of wafer 11. As the temperature of wafer 11 increases to about 900° K. there are corresponding periodic increases and decreases in the amplitude of the output of detector 22.

In accordance with one aspect of the present invention, these variations in the output of detector 22 are combined with the output of pyrometer 15 to derive an indication of the temperature of wafer 11. The sinusoidal intensity variation of reflected optical energy of laser 17 from front face 41 of wafer 11 occurs because of thermal expansion of the wafer thickness as a function of temperature. As the wafer thickness varies, there are corresponding variations in the constructive and destructive interference patterns of the reflected optical energy from the front face of wafer 11, as in a laser interferometer.

The signal derived by an infinitely broadband optical pyrometer 15 viewing a gray body is represented by:

$$I_p = e\sigma T^4 \quad (7)$$

where $I_p$ = the intensity of radiant energy from front face 41 incident on pyrometer 15, e = the emissivity of radiant energy from wafer 11, $\sigma$ = the Stefan-Boltzmann constant =

$$5.670 \times 10^{-8}\frac{\text{watt}}{m^2(\text{°Kelvin})^4},$$

T = °Kelvin.

The amplitude of the radiant energy detected by pyrometer 15 is determined by computer 23 for two different adjacent maxima or minima in the amplitude of an output signal derived by detector 22. It can be validly assumed that the emissivity of wafer 11 remains constant between adjacent maxima or minima in the sinusoidal output of detector 22 as the temperature of wafer 11 changes. The temperature difference, δ, between adjacent peaks of the sinusoidal output of a wafer fabricated of known materials can be determined. For example, for a silicon wafer having a diameter of 150 mm, there is a temperature change of 6° K. which occurs between adjacent temperature peaks or troughs. The emissivity of wafer 11 is effectively calculated from this known temperature separation between adjacent peaks or troughs in the output of detector 22, by monitoring the intensities detected by pyrometer 15 at the time these two peaks occur. From the determined emissivity, temperature is calculated in accordance with $$T = \left[\frac{I_p(T_0)}{e\sigma}\right]^{\frac{1}{4}} \quad (8)$$

Emissivity is calculated by solving for e in the following equation:

$$\left[\frac{I_p(T_0)}{e\sigma}\right]^{\frac{1}{4}} = \left[\frac{I_p(T_0 + \delta)}{e\sigma}\right]^{\frac{1}{4}} + n\delta \quad (9)$$

where $I_p(T_0)$ = the intensity of optical energy monitored by pyrometer 15 at the first peak or trough in the output of detector 22, $I_p(T_0+\delta)$ = the output of pyrometer 15 for the peak or trough adjacent the first named peak or trough, and each of e, $\sigma$, and $\delta$ has been previously defined.

Figure 4:
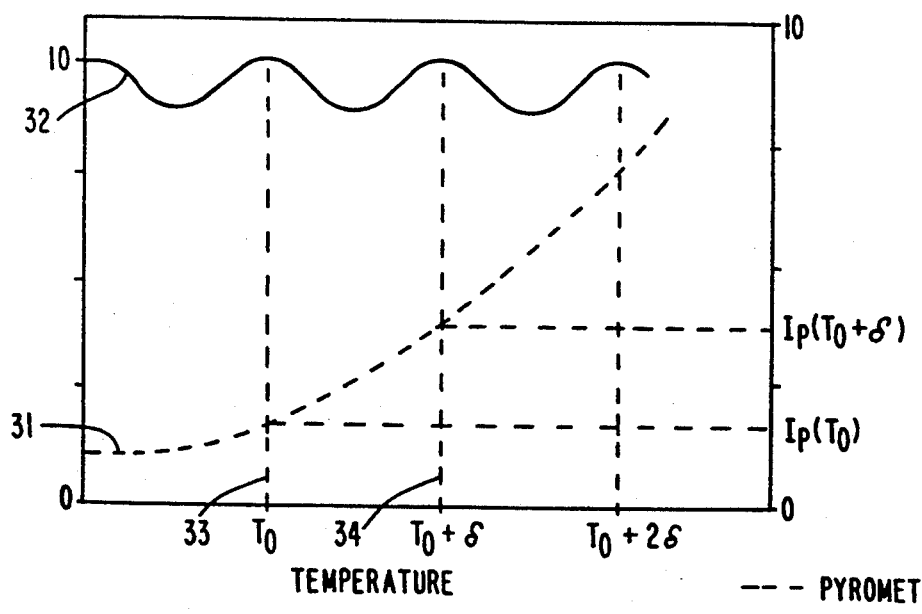
FIG. 4 is a plot of the outputs of the inferometer and an applicable pyrometer, useful in describing the manner in which a computer using the present invention determines temperature and emissivity of a silicon wafer being monitored with the apparatus of FIG. 1.

To provide a more complete understanding of the manner in which computer 23 determines temperature and emissivity, reference is made to FIG. 4, where the outputs of detectors 15 and 22 are plotted against temperature. In FIG. 4, the outputs of pyrometer 15 and detector 22 are respectively illustrated as exponential wave 31 and sinusoidal wave 32. Adjacent peaks of wave 32 occur at temperatures $T_0$ and $(T_0+\delta)$ When detector 22 derives peaks at $T_0$ and $(T_0+\delta)$ pyrometer 15 derives signals having values of $I_p(T_0)$ and $I_p(T_0+\delta)$, respectively. The values of $I_p(T_0)$ and $I_p(T_0+\delta)$ are at the intersections of vertical lines 33 and 34, representing temperatures $T_0$ and $R_0+\delta$, and wave 31. From the monitored values of $I_p(T_0)$ and $I_p(T_0+\delta)$, as well as the known values of $\sigma$, and $\delta$, computer 23 can effectively determine the value of e. From the value of e, computer 23 determines the value of T from $I_p(T) = e \sigma T^4$. In other words, temperature is calculated from the intensity monitored by pyrometer 15 in accordance with:

$$T = \left[ \frac{I_p(T_0)}{e\sigma} \right]^{\frac{1}{4}} \quad (10)$$

It is also possible to determine the temperature of substrate 11 directly, without determining emissivity, if it is assumed that pyrometer 15 is a broad band device, responsive to all the radiant energy emitted from a gray body substrate. In such an instance, it can be shown that the temperature can be calculated as $$T = \frac{\delta}{\left( \frac{I_p(T+\delta)}{I_p(T)} \right)^{\frac{1}{4}} - 1} \quad (11)$$

Emissivity can be calculated from the computed value of T (p) as:

$$e = \frac{I_p(T)}{\sigma[T(p)]^4} \quad (12)$$

Figure 5:
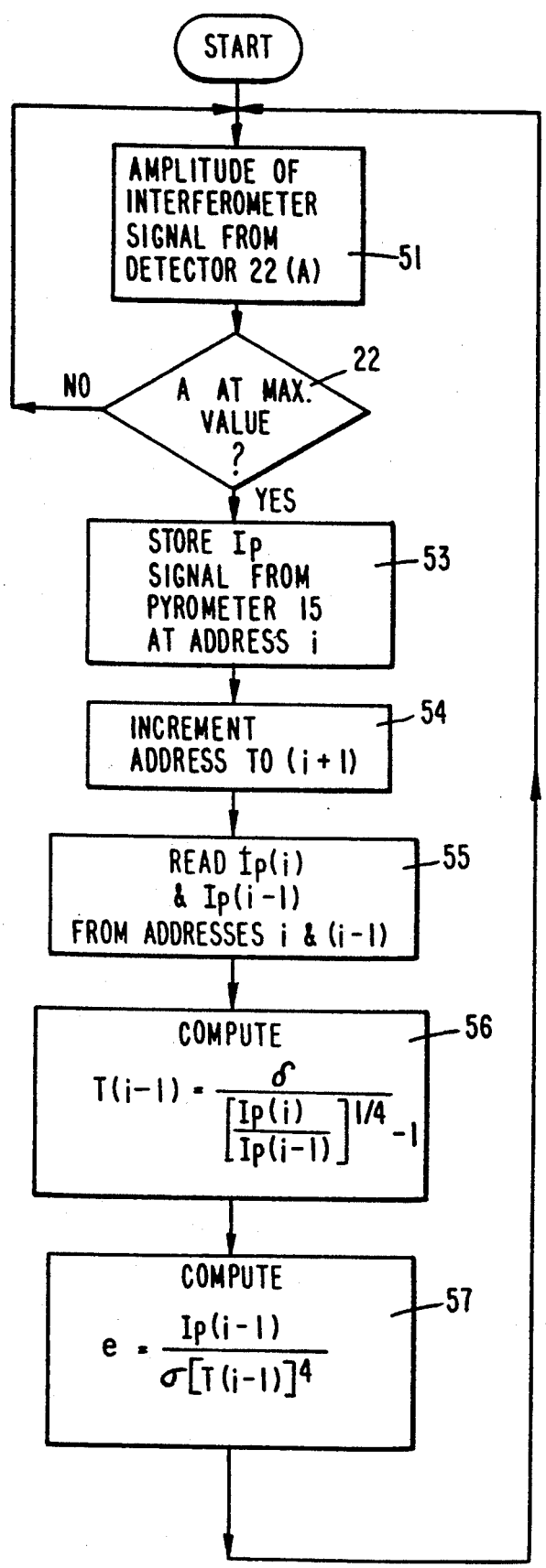
FIG. 5 is a flow diagram of a computer program for determining wafer temperature and emissivity, in accordance with a specific embodiment of the invention.

A flow diagram for the operations performed by computer 23 to determine temperature and emissivity in response to the outputs of pyrometer 15 and detector 22 is illustrated in FIG. 5. As illustrated in FIG. 5, the first step in a subroutine to determine temperature and emissivity is to monitor the amplitude, A, of the inferometer signal derived from detector 22, as indicated by step 51. During operation 52, a determination is made as to whether the amplitude, A, monitored during step 51, has a maximum value. In response to step 52 indicating that A does not have a maximum value, the program returns to step 51.

In response to the value of A being at a maximum value, the program advances to step 53, during which the amplitude of signal, $I_p$, derived from pyrometer 15 is stored in a memory of the computer at address i. After signal $I_p$ is stored at address i, the memory is incremented to address (i+1), as indicated by operation 54 Then, the values of $I_p$ (i) and $I_p$ (i−1) are read from addresses i and (i-1) during operation 55. In other words, during operation 55, the amplitudes of the signal from pyrometer 15 at the two most recent maxima of the output of detector 22 are read.

After $I_p$ (i) and $I_p$ (i−1) are read during operation 55 and stored in registers of a microprocessor included in computer 23, the microprocessor computes temperature at the next preceding maximum during operation 56 in accordance with:

$$T(i-1) = \frac{\delta}{\left[ \frac{I_p(i)}{I_p(i-1)} \right]^{\frac{1}{4}} - 1} \quad (13)$$

The value of temperature computed during operation is stored in an appropriate address of computer 23. This value is supplied to a display or can be used for control purposes, as appropriate. After operation 56 has been completed, the program can return to operation 51. Alternatively, if it is desired to determine emissivity, operation 57 is performed after operation 56.

During operation 57 emissivity of substrate 11 is calculated in accordance with the stored values of $I_p(i-1)$, the stored value of $\sigma$, and the value of $T(i-1)$ computed during operation 56, as:

$$e = \frac{I_p(i-1)}{\sigma[T(i-1)]^4} \quad (14)$$

If the value of emissivity is calculated during operation 57, it is supplied to a display included in computer 23.

Since very few pyrometers can be considered as equally responsive to all wavelengths of radiant energy emitted from substrate 11, it is usually necessary to modify Equation (13) to reflect the characteristics of each particular pyrometer. Because of the very large number of pyrometers available, no attempt is made herein to indicate the various factors involved in determining temperature more accurately than is set forth in operation 56. One of ordinary skill in the art can modify Equation (13) in accordance with known characteristics of different commercially available pyrometers 15.

While there has been described and illustrated one specific embodiment of the invention, it will be clear that variations in the details of the embodiment specifically illustrated and described may be made without departing from the true spirit and scope of the invention as defined in the appended claims.

I claim:

1. A non-contact method of determining the temperature of a plate that is not opaque to optical energy, the method comprising detecting the intensity of radiant energy emitted from the plate and deriving a first indication of said detected intensity, irradiating the plate with said optical energy, said optical energy interacting with the plate to provide alternate constructive and destructive interference patterns as the plate temperature varies and deriving a second indication of the amplitude of said patterns, and combining said second indication of the amplitude of the detected constructive and destructive interference patterns as the plate temperature varies and said first indication of the detected intensity of the emitted radiant energy to provide an indication of the plate temperature.

2. The method of claim 1 wherein the interference patterns are detected by detecting the intensity of the optical energy in the interference patterns, responding to the detected intensity to detect predetermined phase positions of the interference patterns, the detected intensity of the emitted radiant energy being detected at the detected predetermined phase positions, and combining the detected intensity at a pair of spaced detected predetermined phase positions.

3. The method of claim 2 wherein the predetermined phase positions are spaced by $2\pi$ radians.

4. The method of claim 3 wherein the phase positions occur at adjacent maxima or minima in the intensity of the optical energy in the interference patterns.

5. In combination, a processing chamber for a semiconductor substrate, non-contact means for determining the temperature of a semiconductor substrate in the chamber, said non-contact temperature determining apparatus including: means for irradiating a front face of the substrate with optical energy, the wavelength of the optical energy and the substrate being such that constructive and destructive interference patterns are derived as the temperature of the substrate varies, means for detecting the intensity of the optical energy in the constructive and destructive interference patterns as the temperature of the substrate varies, optical pyrometer means for detecting the intensity of radiation emitted from the substrate, and means for combining responses indicative of the intensity detected by said optical pyrometer means and indicative of the intensity of the optical radiation detected by said means for detecting the intensity of the optical energy in the constructive and destructive interference patterns as the temperature of the substrate varies to provide a signal indicative of the substrate temperature.

6. The combination of claim 5 wherein the means for combining the responses responds to the detected intensity to detect predetermined phase positions of the interference patterns, the detected intensity of the emitted radiant energy being detected at the detected predetermined phase positions, and the combining means combining the detected intensity at a pair of spaced detected predetermined phase positions.

7. The combination of claim 6 wherein the predetermined phase positions are spaced by $2\pi$ radians.

8. The combination of claim 7 wherein the phase positions occur at adjacent maxima or minima in the intensity of the optical energy in the interference patterns.

9. Non-contact apparatus for determining the temperature of a plate comprising means for irradiating the plate with optical energy, the wavelength of the optical energy and the plate being such that alternate constructive and destructive interference patterns occur as the plate temperature varies, means for detecting the intensity of the optical energy in the alternate constructive and destructive interference patterns as the plate temperature varies, optical pyrometer means for detecting the intensity of radiation emitted from the substrate, and means for combining responses indicative of the intensity detected by said optical pyrometer means and indicative of the intensity of the optical radiation detected by said means for detecting the intensity of the optical energy of the alternate constructive and destructive interference patterns as the plate temperature varies to provide a signal indicative of the plate temperature.

10. The apparatus of claim 9 wherein the means for combining the responses responds to the detected intensity to detect predetermined phase positions of the interference patterns, the detected intensity of the emitted radiant energy being detected at the detected predetermined phase positions, the combining means combining the detected intensity at a pair of spaced detected predetermined phase positions.

11. The apparatus of claim 10 wherein the predetermined phase positions are spaced by $2\pi$ radians.

12. The apparatus of claim 11 wherein the phase positions occur at adjacent maxima or minima in the intensity of the optical energy in the interference patterns.

13. A method of determining the temperature of a plate undergoing dynamic temperature changes causing the plate thickness to change, comprising irradiating the plate with optical energy, the plate being non-opaque to the optical energy so that constructive and destructive interference patterns of the optical energy are derived from the plate in response to the temperature and thickness changes, the constructive and destructive interference patterns resulting in a beam of the optical radiation having intensity variations that are periodic as a function of the plate temperature, the intensity variations as a function of plate thickness having a known period, monitoring the intensity of radiation emitted from the plate at times when the intensity of the optical radiation is at predetermined angular positions of the periodic function, and combining indications of the separation of the angular positions and the intensity of said monitored radiation to derive the temperature indication.

14. The method of claim 13 wherein the predetermined angular positions are where the intensity of the optical energy as a function of temperature variations has a zero slope.

15. The method of claim 13 wherein the predetermined angular positions are at adjacent maxima in the intensity of the optical energy as a function of temperature variations.

16. The method of claim 13 wherein the predetermined angular positions are at corresponding angular positions in adjacent periods of the intensity variations.

17. The method of claim 13 wherein the optical energy is monochromatic.

18. Apparatus for determining the temperature of a plate undergoing dynamic temperature changes causing the plate thickness to change, comprising means for irradiating the plate with optical energy, the plate being non-opaque to the optical energy so that constructive and destructive interference patterns of the optical energy are derived from the plate in response to the temperature and thickness changes, the constructive and destructive interference patterns resulting in a beam of the optical radiation having intensity variations that are periodic as a function of the plate temperature, the intensity variations as a function of plate thickness having a known period, means responsive to the radiation having said periodic intensity variations and the intensity of radiation emitted from the plate at times when the intensity of the optical radiation is at predetermined angular positions of the periodic function for combining indications of the separation of the angular positions and the intensity of said monitored radiation to derive the temperature indication.

19. The apparatus of claim 18 wherein the predetermined angular positions are where the intensity of the optical energy as a function of temperature variations has a zero slope.

20. The apparatus of claim 18 wherein the predetermined angular positions are at adjacent maxima in the intensity of the optical energy as a function of temperature variations.

21. The apparatus of claim 18 wherein the predetermined angular positions are at corresponding angular positions in adjacent periods of the intensity variations.

22. The apparatus of claim 18 wherein the optical energy is monochromatic.

23. A non-contact method of determining the temperature of a plate that is not opaque to optical energy, the method comprising detecting the intensity of radiant energy passively emitted from the plate and deriving a first indication of said detected intensity, irradiating the plate with said optical energy, said optical energy interacting with the plate to provide alternate constructive and destructive interference patterns as the plate temperature varies and deriving a second indication of the amplitude of said patterns, and combining said second indication of the amplitude of the detected constructive and destructive interference patterns as the plate temperature varies and said first indication of the detected intensity of the emitted radiant energy to provide an indication of the plate temperature.

24. In combination, a processing chamber for a semiconductor substrate, non-contact means for determining the temperature of a semiconductor substrate in the chamber, said non-contact temperature determining apparatus including: means for irradiating a front face of the substrate with optical energy, the wavelength of the optical energy and the substrate being such that constructive and destructive interference patterns are derived as the temperature of the substrate varies, means for detecting the intensity of the optical energy in the constructive and destructive interference patterns as the temperature of the substrate varies, optical pyrometer means for detecting the intensity of radiation passively emitted from the substrate, and means for combining responses indicative of the intensity detected by said optical pyrometer means and indicative of the intensity of the optical radiation detected by said means for detecting the intensity of the optical energy in the constructive and destructive interference patterns as the temperature of the substrate varies to provide a signal indicative of the substrate temperature.

25. Non-contact apparatus for determining the temperature of a plate comprising means for irradiating the plate with optical energy, the wavelength of the optical energy and the plate being such that alternate constructive and destructive interference patterns occur as the plate temperature varies, means for detecting the intensity of the optical energy in the alternate constructive and destructive interference patterns as the plate temperature varies, optical pyrometer means for detecting the intensity of radiation passively emitted from the substrate, and means for combining responses indicative of the intensity detected by said optical pyrometer means and indicative of the intensity of the optical radiation detected by said means for detecting the intensity of the optical energy of the alternate constructive and destructive interference patterns as the plate temperature varies to provide a signal indicative of the plate temperature.

* * * * *